United States Patent
Kelly et al.

[11] Patent Number: 6,036,809
[45] Date of Patent: Mar. 14, 2000

[54] PROCESS FOR RELEASING A THIN-FILM STRUCTURE FROM A SUBSTRATE

[75] Inventors: Kimberley A. Kelly, Poughkeepsie; Ashwani K. Malhotra, Newburgh; Eric D. Perfecto; Roy Yu, both of Poughkeepsie, all of N.Y.

[73] Assignee: International Business Machines Corporation, Armonk, N.Y.

[21] Appl. No.: 09/250,882

[22] Filed: Feb. 16, 1999

[51] Int. Cl.[7] .............................. B32B 31/00; B32B 4/00; H01B 13/00; H01L 29/12; B44C 1/165

[52] U.S. Cl. .................... 156/247; 156/344; 156/230; 156/233; 156/239; 216/13; 216/20; 438/974; 438/977; 428/620

[58] Field of Search ................................. 156/247, 344, 156/230, 233, 239, 236, 241; 216/13, 18, 20; 428/620; 438/974, 977

[56] References Cited

U.S. PATENT DOCUMENTS

| | | |
|---|---|---|
| 4,480,288 | 10/1984 | Gazdik et al. . |
| 4,879,156 | 11/1989 | Herron et al. . |
| 4,926,549 | 5/1990 | Yoshizawa et al. . |
| 5,231,751 | 8/1993 | Sachdev et al. . |
| 5,258,236 | 11/1993 | Arjavalingam et al. . |
| 5,452,182 | 9/1995 | Eichelberger et al. . |
| 5,518,674 | 5/1996 | Powell et al. . |
| 5,534,466 | 7/1996 | Perfecto et al. . |

FOREIGN PATENT DOCUMENTS

| | | |
|---|---|---|
| 0 481 736 | 4/1992 | European Pat. Off. . |
| 0 543 364 | 5/1993 | European Pat. Off. . |

OTHER PUBLICATIONS

B. K. Furman et al, "Decal Pattern Transfer by Ultrasonic/Thermocompression Bonding," Research Disclosure No. 333, Jan. 1992.

K. Prasad et al., "Multilevel Thin Film Packaging: Applications and Processes for High Performance Systems," IEEE Transactions on Components, Packaging and Manufacturing Technology, V17, 1, (1994), pp. 38–49.

Daniel G. Berger et al, "Evaluation of Multi–Level Thin Film Structures—A Case Study," OSHAM/IEPS 4th Annual International Conference and Exhibition on Multi–Chip Modules, Denver (1995), pp. 216–222.

E. P. Skarvinko et al., "Process for Manufacturing Polymer Film for Use as a Printed Circuit Substrate Decal–On–Glass," Research Disclosure No. 292, Aug. 1988.

G. Kraus et al., "Process for Transferring Thin–Film Conductor Patterns to a Multilayer Ceramic Substrate for Semiconductor Chips," IBM Technical Disclosure Bulletin, vol. 27, No. 3, pp. 1404–1405, Aug. 1984.

P. H. Berasi et al., "Simplified Transferable Metallurgy Pattern with High Density Capability," IBM Technical Disclosure Bulletin, vol. 32, No. 5B, pp. 189–190, Oct. 1989.

*Primary Examiner*—Curtis Mayes
*Assistant Examiner*—J. A. Lorengo
*Attorney, Agent, or Firm*—Ratner & Prestia; Tiffany L. Townsend

[57] ABSTRACT

A process for fabricating and releasing a thin-film structure from a primary carrier for further processing. The thin-film structure is built on a metal interconnect disposed on a dielectric layer which, in turn, is deposited on a primary carrier. The thin-film structure and metal interconnect are released from the dielectric layer and primary carrier along a release interface defined between the metal interconnect and the dielectric film. Release is accomplished by disturbing the interface, either by laser ablation or dicing. The process of the present invention has at least three, specific applications: (1) the thin-film structure and metal interconnect can be released to yield a free-standing film; (2) the thin-film structure and metal interconnect can be laminated onto a permanent substrate (when building top-side down structures) and then released; and (3) the thin-film structure can be transferred to a secondary temporary carrier (when building top-side up structures) for further processing and testing, then transferred to a permanent substrate before releasing the thin-film structure and metal interconnect.

15 Claims, 4 Drawing Sheets

PROCESS FOR RELEASING A THIN-FILM STRUCTURE FROM A SUBSTRATE

TECHNICAL FIELD

The present invention relates generally to a process for releasing a thin-film structure from a substrate and, more particularly, to a process for releasing a multi-level thin-film structure from a glass plate carrier.

BACKGROUND OF THE INVENTION

As advancement in semiconductor integrated circuit (IC) technology continues to increase, packaging interconnection and integration will be strongly challenged to meet new standards. At the system level, the multi-chip module (MCM) technology contributes to making the processor smaller, faster, and easier to use. When designers take full advantage of MCM capability, overall cost reduction can often be realized when compared to the cost of the individual packaging components assembled. Increasing demands are emerging for higher performance and, therefore, requirements such as high bandwidths, lower packaging inductance, increased density, matched impedance, and shorter propagation delays must be met. Interconnection designs are using thin-film technology, including multi-layer thin-film (MLTF) structures, to address these requirements.

Thin-film structures are composed of metal and dielectric layers comprising, among other materials, copper and polyimide. Such structures are used in the microelectronics industry either to interconnect semiconductor devices (chips) or by themselves as thin-film connectors. The interconnect structure includes alternating layers of electrically insulating and conductive materials. Vias in the insulating material provide electrical connections between the conductor layers and bond pad terminations on semiconductor devices. The number of conductor layers depends on the signal routing, grounding, and shielding requirements for the interconnect.

A thin-film wiring layer can be fabricated in a variety of ways by conventional semiconductor processing techniques. For example, non-planar thin-film structures can be fabricated by subtractive etching or by pattern electroplating. Sputtered chrome-copper-chrome (Cr—Cu—Cr) metallurgy is used for subtractive etching. For wiring levels, a patterned resist is used to define the features and the Cr—Cu—Cr is chemically etched. Pattern electroplating wiring processes require the deposition of a thin chrome-copper metal seed followed by copper electroplating through a patterned resist. Subsequently, the photoresist is stripped and the seed is chemically etched.

The interconnect is fabricated on a standard processing substrate. Silicon, ceramic, glass, or polished metals can be used as the processing substrate. Once the multi-layer interconnect structure is complete, it is removed from the processing substrate to yield a free-standing film. Removal of the interconnect from the substrate can be accomplished by several different methods. Such methods include, for example, using a separating agent or release layer or chemically etching the substrate away. The completed interconnect is then electrically coupled to suitable electronic circuitry. Such coupling can be achieved using a variety of techniques including, for example, wire bonding, solder reflow, thermal compression bonding, ultrasonic bonding, or laser bonding. The preferable technique depends upon the type of metal used for bond pad terminations and the stackup of the multi-layer structure.

The present invention focuses on removal of the interconnect from the processing substrate or carrier. An improvement in the process for producing MLTF structures is disclosed in U.S. Pat. No. 5,258,236, issued to Arjavalingam et al. and assigned to the assignee of the present invention. The '236 patent discloses building the MLTF structure as a "decal" on a transparent carrier. A polyimide layer is disposed between the MLTF structure and the carrier. The polyimide layer serves as a release layer to remove the MLTF structure from the carrier before joining the MLTF structure to a ceramic substrate. The release process disclosed is a laser ablation of the polyimide layer through the transparent substrate material.

Although the process of the '236 patent has proven successful in permitting simultaneous fabrication of the multi-layer thin-film interconnection structure and a ceramic substrate before the two are joined, it has certain limitations. Laser ablation must be performed over the whole surface area of the decal. Perhaps most important, an external frame must be attached to the MLTF structure decal before release from the carrier on which the decal is formed. The frame supports the MLTF structure decal after it is released. A relatively cumbersome alignment and lamination process, involving high-temperature adhesives, is required to attach the frame to the decal. In addition, the step of framing the decal reduces the productivity of the process of the '236 patent: a frame area on each side of the individual MLTF decal sections, or "chicklets," must be reserved for handling purposes. This requirement reduces the productive surface area on the carrier by up to fifty percent. Moreover, the carrier material is limited because it must be transparent to a pre-determined wavelength (i.e., 308 nm) of electromagnetic radiation.

U.S. Pat. No. 5,518,674 issued to Powell et al. describes a method of forming thin-film flexible interconnects for infrared detectors. The interconnect is removed from a substrate to form a free-standing film. When a polymer film is provided on a silicon substrate having a surface with either diluted or no adhesion promoter, the interconnect structure is removed from the substrate in hot water. A hot steam environment might be substituted for the hot water bath. In either case, the polymer absorbs water readily and swells sufficiently to break the polymer bond to the substrate. When the substrate surface preparation involves the use of a release layer, the interconnect structure is removed by soaking in an appropriate solvent which will dissolve the release layer. Because the MLTF fabrication requires immersion in various aqueous and solvent chemicals, however, a chemically insensitive release layer is desirable. Removal of the interconnect is accomplished by dissolving the substrate in an appropriate etchant if a metal substrate such as aluminum is used.

U.S. Pat. No. 5,534,466, issued to Perfecto et al. and assigned to the assignee of the present invention, also involves a process for transferring a thin-film wiring layer to a substrate in the construction of multi-layer chip modules. A sacrificial release layer is provided on the surface of a carrier. Then a thin-film structure is provided on the release layer. The thin-film structure has at least one dielectric material and at least one wiring path of electrically conductive material. At least a portion of the electrically conductive material is exposed on the surface of the thin-film structure opposite the carrier. Also provided are a substrate and a joining composition on one or both of the exposed electrically conductive surface of the thin-film structure or the substrate. The thin-film structure is applied to the substrate so that the attached carrier is remote from the substrate, and the thin-film structure and attached carrier are joined to the substrate. Finally, the release layer is contacted with an etchant for the release layer to remove the carrier from the thin-film structure.

The processes taught by Powell et al. in the '674 patent and Perfecto et al. in the '466 patent involve chemically etching a release layer. The etchant must be substantially inert to the dielectric layer and the electrically conductive layer of the thin-film structure. Otherwise, these layers must be protected against attack by the etchant. At least some dielectric and electrically conductive materials are highly susceptible to such attack. For example, aluminum etches readily. The requirement of chemically etching complicates the process of removing the interconnect from the processing substrate or carrier, therefore, and renders further processing more difficult.

To overcome the shortcomings of the conventional processes which remove an interconnect from a processing substrate or carrier, a new process for releasing a thin-film interconnect structure from a carrier substrate is provided. An object of the present invention is to provide a MLTF structure and process of fabrication which eliminate the need for additional framing as the MLTF structure is joined to an electronic packaging substrate. A related object is to provide an improved MLTF manufacturing process which increases the yield on the carrier substrate on which the MLTF structure is formed. Another object is to provide an improved process of transferring a MLTF structure to a substrate to form a single chip module (SCM) or MCM. It is still another object of the present invention to provide a method of manufacturing and joining a MLTF structure to a substrate which increases productivity while reducing costs. An additional object is to permit reuse of the carrier substrate after the MLTF structure has been released. Yet another object of this invention is to provide a MLTF structure which can be easily handled. The present invention also seeks to avoid the use of chemical etchants.

SUMMARY OF THE INVENTION

To achieve these and other objects, and in view of its purposes, the present invention provides a process for fabricating and releasing a thin-film structure from a primary carrier for further processing. The thin-film structure is built on a metal interconnect (preferably a Cr—Cu—Cr trilayer) disposed on a dielectric layer (preferably a polyimide) which, in turn, is deposited on a primary carrier (preferably a glass plate). The thin-film structure and metal interconnect are released from the dielectric layer and primary carrier along a release interface defined between the metal interconnect and the dielectric film. Release is accomplished by disturbing the interface, either by laser ablation or dicing. The process of the present invention has at least three, specific applications: (1) the thin-film structure and metal interconnect can be released to yield a free-standing film; (2) the thin-film structure and metal interconnect can be laminated onto a permanent substrate (when building top-side down structures) and then released; and (3) the thin-film structure can be transferred to a secondary temporary carrier (when building top-side up structures) for further processing and testing, then transferred to a permanent substrate before releasing the thin-film structure and metal interconnect.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. One the contrary, the dimensions of the various features are arbitrarily expanded or reduced for clarity. Included in the drawing are the following figures.

DETAILED DESCRIPTION OF THE INVENTION

Figure 1:
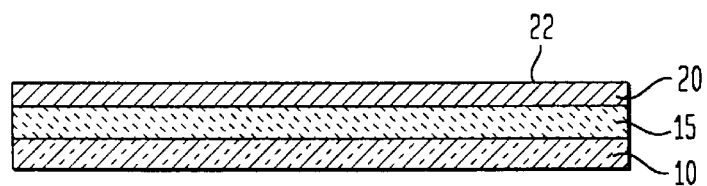
FIG. 1 is a cross-sectional view of the trilayer substrate, consisting of a carrier layer, a polymer dielectric layer, and a metal interlayer, upon which a MLTF structure can be manufactured according to the process of the present invention.

Referring now to the drawing, in which like reference numbers refer to like elements throughout, FIG. 1 illustrates a substrate or carrier 10 made of any suitable material on which a multi-layer thin-film (MLTF) structure can be fabricated. Carrier 10 may have any suitable diameter or dimension, for example, 125 mm or more on a side, typically 300–800 mm or larger on a side, and a suitable thickness, for example, 0.5 to 10 mm.

The various substrates that are used in high performance systems are: (1) silicon; (2) dry-pressed alumina; (3) cofired alumina; (4) cofired glass-ceramic; and (5) glass. Preferred for use in the present invention is a large panel glass carrier 10. Surface preparation of carrier 10 is an important process step before MLTF fabrication. Carrier 10 should have a roughness of less than 1,000 Å and should have a flatness of 10 µm or less. These surface characteristics may be achieved by lapping and polishing carrier 10. The surface of carrier 10 is then cleaned and modified by chemical or physical mechanisms before dielectric deposition.

A suitable liquid polymer dielectric layer (such as polyimide) 15 is dispensed and spun onto carrier 10 using standard semiconductor fabrication techniques. Polyimide 15 forms a blanket or coating entirely covering carrier 10. Four different types of polyimide 15 are typically used to fabricate thin film structures: poly(pyromelitic dianhydrideoxydianiline) or "PMDA-ODA," poly(3,3',4,4'-biphenyl tetracarboxylic dianhydride-p-phenylene diamine) or "BPDA-PDA," polyamic ethyl ester, and photosensitive polyimides (PSPI).

As the number of thin-film wiring layers and the layer thickness have increased, selection criteria for polyimide dielectrics have been established. Such criteria include: (1) low intrinsic stress to improve the multi-level structure and reliability; (2) high fracture toughness for processability; (3) excellent self-adhesion and adhesion to several metals for reliability; (4) reworkability before full cure to enhance yield; (5) compatibility with other process solvents for processability; (6) a dielectric constant of 3.5 or lower for electrical performance; (7) thermal stability to 400° C. for flip chip and pin grid array connections; (8) low moisture and solvent uptake for reliability; and (9) stable viscosity and long shelf life for manufacturability. BPDA-PDA and polyamic ethyl ester meet all the requirements with BPDA-PDA having the lower moisture uptake and internal stress. PMDA-ODA has been used successfully to implement the present invention.

The thickness of polyimide 15 can be regulated to customize particular strength, flexibility, and dielectric properties. Thicknesses of about 6–7 µm have been found to provide an adequate tradeoff among these criteria, although this thickness can vary. The particular polyimide 15 and carrier 10 chosen should have compatible thermal expansion rates to avoid excessive stress during processing. To improve adhesion between polyimide 15 and metal layers, the interface can be chemically or physically modified. Polyimide 15 is cured, after deposition on carrier 10, to at least 350° C.

A layer of electrically conductive metal is then deposited onto polyimide 15 to form a metal interlayer 20 having a top surface 22. Deposition can be accomplished by evaporation, sputtering, or other conventional techniques. Metal interlayer 20 must extend beyond the active area 48 of the MLTF structure subsequently formed on top surface 22 and, as shown in FIG. 1, generally covers completely the top surface of polyimide 15. Among its other functions, metal interlayer 20 forms a support layer for structural rigidity.

The metal used to form metal interlayer 20 is typically a high-stress metal or metal alloy such as Ni, TiW, Cr, Ta, and the like. Aluminum, gold, nichrome, or any other thin-film deposited, electrically conductive metal or alloy could also be used. High-stress metals and alloys permit relatively easy release from polyimide 15. Electrically conductive metal interlayer 20 is preferably alternate layers of Cr, then Cu, and then Cr, to form a trilayer structure. To enhance adhesion of Cu to polyimide 15, and to prevent interaction between Cu and polyimide 15, the Cu is sandwiched between the two layers of Cr. The relatively weak adhesion of Cr—Cu—Cr metal interlayer 20 to polyimide 15 permits relatively easy release from polyimide 15, once a point crack is created by disturbing the interface during dicing. Thus, at least part of the force tapped to release metal interlayer 20 from polyimide 15 is derived from the stress in metal interlayer 20, the weak adhesion between metal interlayer 20 and polyimide 15, or both.

A Cr—Cu bilayer or other metals, such as aluminum, can be used instead of Cr—Cu—Cr to form metal interlayer 20. Metal interlayer 20 can form the terminal metal layer of the MLTF structure to be fabricated on metal interlayer 20. Metal interlayer 20 can also serve as an electrical ground plane for the MLTF structure following fabrication.

The thicknesses of carrier 10, polyimide 15, and metal interconnect 20 are regulated to meet structural requirements. The chrome of metal interconnect 20, which is used as the adhesive layer to dielectric polyimide 15, has a thickness between 200 Å to 1,000 Å (0.02 to 0.1 µm). The opposing layer of chrome, creating a sandwich structure in which the copper is surrounded, also facilitates adhesion and has a similar thickness. The copper thickness is adjusted to meet electrical requirements and is typically between 2 µm and 6 µm. As used in the current invention, therefore, the combined Cr—Cu—Cr metal interlayer 20 can have a thickness as low as about 2 µm.

Figure 2:
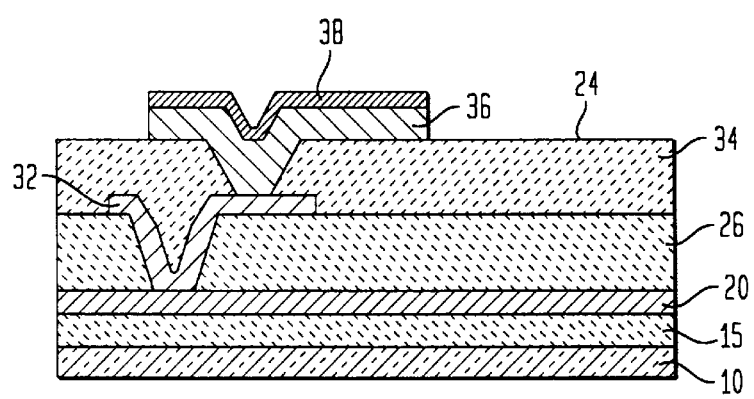
FIG. 2 is a cross-sectional view of the MLTF structure on the metal interlayer, the polyimide layer, and the glass plate carrier, before the release process step of the present invention is applied.

The MLTF structure is formed upon metal interlayer 20. Formation may be in a "top side up" configuration or in an "upside down" configuration. In the "upside down" configuration, the layer which will constitute the final top side of the completed chip is fabricated initially at the bottom of the MLTF structure, adjacent to metal interlayer 20. FIG. 2 illustrates one example of a MLTF structure manufactured upon metal interlayer 20 in the "upside down" position.

The first step is to apply and pattern the vias in a dielectric layer 26. Preferred dielectric materials include polyimides, epoxies, and benzocyclobutene (sold by Dow Chemical Co. under the trademark CYCLOTENE®), or other high-temperature polymer compositions. The steps for forming the MLTF structure are those otherwise conventionally used in the art, such as wet and dry processes. These steps include applying a metal layer 32, for example, by sputtering a Cr—Cu seed layer, applying a photoresist material to define a wiring level, and electroplating a wiring metal such as copper or other desired electrically conductive material. The photoresist material is then stripped and the metallic seed layer is etched with a suitable etchant.

The metal layer 32 has a thickness typically between 1.0 and 5.0 µm. The metal layer 32 can form the terminal metal layer if it is the last thin film layer of the MLTF structure. More typically, however, the metal layer 32 will permit connection to other components to be formed. Metal layer 32 may be, for example, chromium, copper, or nickel, and may include other metals.

The fabrication of the MLTF structure is then continued, in the manner described above, until completed. This process may include the addition of one or more dielectric layers 34 and metallic wiring layers 36 as shown by way of example in FIG. 2 to form a plurality of thin-film wiring layers. Copper or aluminum may be used for the wiring.

In accordance with one embodiment of the present invention, there may be applied a layer of a joining composition 38 such as a suitable lead-tin solder to the last metallic layer of the MLTF structure, such as metallic wiring layer 36. The "last" layer as formed on metal interlayer 20 is actually the lowest layer of the MLTF structure as it will be applied later to the substrate in producing the SCM or MCM. The purpose of the joining composition 38 is to connect the MLTF structure physically, electrically, or both physically and electrically to the substrate. Other electrically conductive joining materials can be used in place of solder, for example, electrically conductive filled epoxy. The process described above for building the MLTF on metal interlayer 20 is given by way of example; other processes known in the art may be applied to construct the MLTF.

The MLTF structure is constructed as a matrix on large area carrier 10 so that it can be sectioned or "diced" into a plurality of separate sections or "chicklets." The thin-film structure can cover substantially all of the area of carrier 10 as initially fabricated. No framing areas are required to be used between or around the areas of the individual MLTF sections to be diced from the initial large area matrix, and the thin-film structure can extend to the edges of the individual diced sections.

Figure 3:
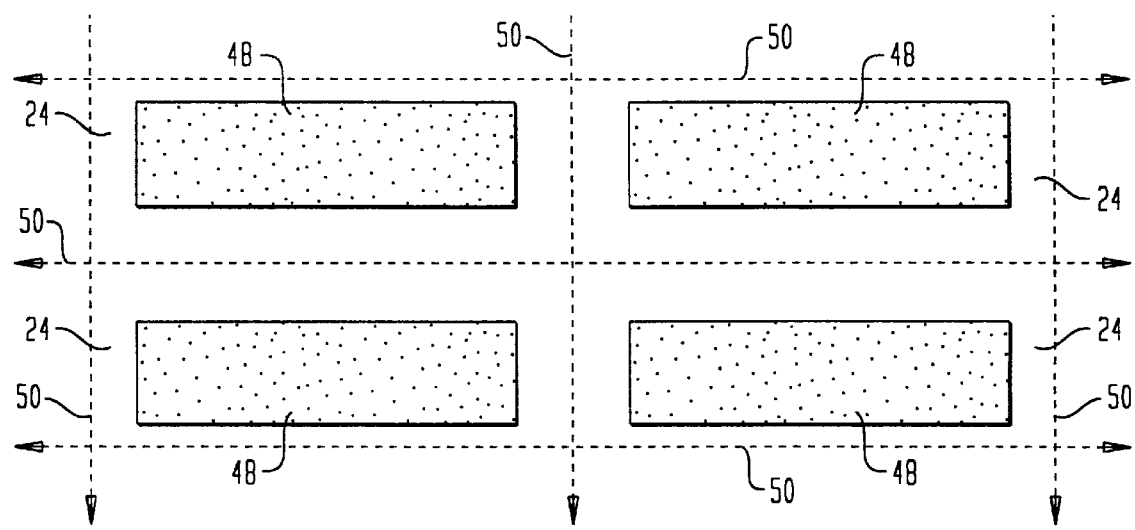
FIG. 3 is a top view of the MLTF structure on the metal interlayer, the polyimide layer, and the glass plate carrier, showing dicing channels according to a first embodiment of the present invention.

FIG. 3 is a top view of the MLTF structure on metal interlayer 20, polyimide 15, and carrier 10. Thus, top surface 24 of dielectric layer 34 and active areas 48 of the MLTF structure are illustrated. Although four MLTF structures are shown, it will be apparent that many more (or fewer) MLTF structures can be formed. Four MLTF structures are illustrated for purposes of example only. Dicing channels 50 are also illustrated in FIG. 3, indicating the locations where the four, individual MLTF structures are cut or "diced" from the overall structure. Dicing channels 50 are located in areas which are free at any metal wiring or other components of active areas 48; thus, dicing channels 50 are located through metal interlayer 20, dielectric layer 26, and dielectric layer 34.

The step of dicing around the desired MLTF structure initiates the process of releasing the MLTF structure from metal interlayer 20. It has been discovered that the chrome in the Cr—Cu—Cr metal interlayer 20 releases from polyimide 15 upon dicing of the structure. Specifically, the chrome delaminates around the perimeter of the structure, allowing the thin-film decal to peel away from polyimide 15 and carrier 10 on which polyimide 15 resides. Thus, the release interface is between metal interlayer 20 and polyimide 15. Although the reasons explaining why dicing causes delamination of metal interlayer 20 from polyimide 15 are not fully understood, it is known that cohesive forces are stronger than adhesive forces. The delamination may be explained by an unzipping at the Cr-to-polyimide interface due to a point crack generated during dicing.

Figure 4:
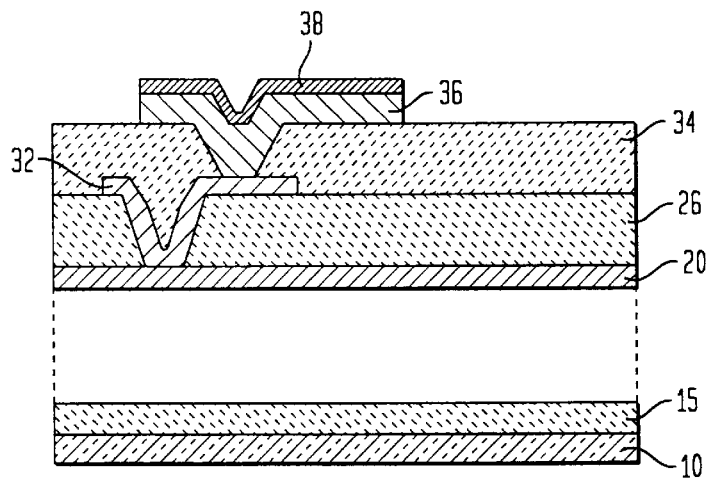
FIG. 4 is a cross-sectional view of the MLTF structure after the thin-film release process of dicing (shown in FIG. 3) is used to separate the thin-film structure from the polyimide layer and the glass carrier.

FIG. 4 illustrates the step of debonding of metal interlayer 20 from polyimide 15 after dicing. The vertical, dashed lines in FIG. 4 show the separation along the release interface between metal interlayer 20 and polyimide 15. The result is a free-standing MLTF structure, having metal interlayer 20 as its terminal metal layer. Once the release of MLTF structure is completed, the structure can be etched by oxygen plasma (thereby removing slight traces of polyimide 15 which may have transferred with metal interlayer 20). Metal interlayer 20 can be photo-defined and etched to form the terminal metal layer. Alternatively, metal interlayer 20 can be completely etched away.

Figure 5:
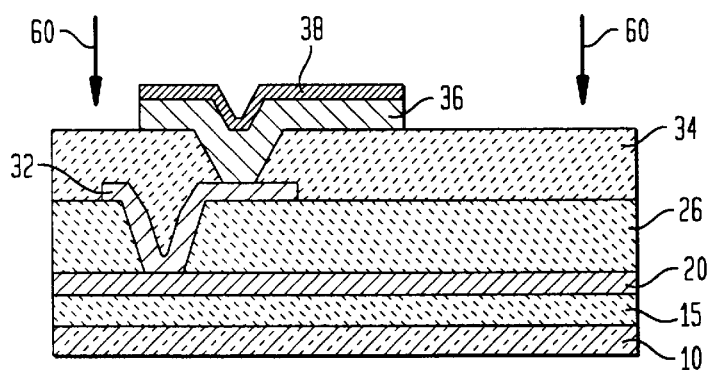
FIG. 5 is a cross-sectional view of the MLTF structure illustrating the application of electromagnetic radiation, through the MLTF structure and the metal interlayer, to ablate the polyimide layer according to a second embodiment of the present invention.

As an alternative to dicing to remove the thin-film structure from carrier 10, polyimide 15 could be laser ablated. The laser ablation embodiment of the present invention is illustrated in FIG. 5. Coherent electromagnetic radiation 60, indicated by the arrows in FIG. 5, is directed from a scanning laser (not shown) through the perimeter of the MLTF structure (not through the active areas 48) and the Cr—Cu—Cr metal interlayer 20 and into polyimide 15 (but not through carrier 10). Coherent electromagnetic radiation 60 ablates the edges of dielectric layers 26 and 34 and polyimide 15 and allows the Cr—Cu—Cr metal interlayer 20 to separate from polyimide 15.

Laser ablation of a polymer layer is known in the art and is discussed, for example, in the '236 patent issued to Arjavalingam et al. As a result of laser ablation, the '236 patent discloses, monomer fragments (i.e., ejected material gas) become trapped between carrier 10 and metal interconnect 20. These fragments form voids in and degrade polyimide 15. Such degradation allows metal interlayer 20 to be separated or released from carrier 10.

Projection laser ablation can be accomplished using electromagnetic radiation from a variety of sources and having a range of characteristics. For example, an excimer (XeCl) laser at 308 nm or a KrF laser operating at 248 nm are suitable sources and wavelengths, respectively. Unlike conventional laser ablation processes, however, the laser ablation process of the present invention is not limited to any particular carrier 10. In fact, the laser ablation process has few critical parameters, and they can be well controlled: (1) laser fluence, (2) number of pulses, and (3) focus. One advantage of laser ablation is that the glass carrier 10 can be reused. Dicing is more efficient and lower in cost, however, than laser ablation.

Figure 6:
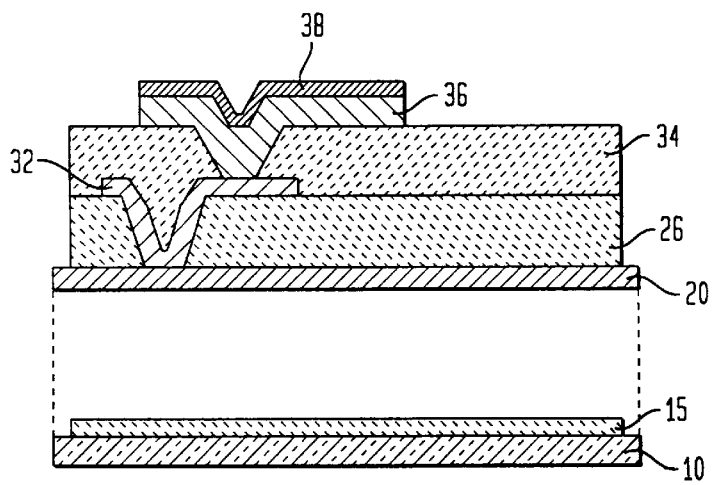
FIG. 6 is a cross-sectional view of the MLTF structure after the thin-film release process of laser ablation (shown in FIG. 5) is used to separate the thin-film structure from the polyimide layer and the glass carrier according to the present invention.

FIG. 6 illustrates the step of debonding of metal interlayer 20 from carrier 10 after laser ablation of polyimide 15. The vertical, dashed lines in FIG. 6 show the separation along the release interface between metal interlayer 20 and polyimide 15. The edges of dielectric layers 26 and 34 and polyimide 15 have been "ablated" or removed. As for the first embodiment of releasing the MLTF structure, namely dicing, the result of the laser ablation release embodiment is a free-standing MLTF structure having metal interlayer 20 as its terminal metal layer. Carrier 10 is also a free-standing structure and can be reused, following the laser ablation embodiment and complete removal of polyimide 15.

Figure 7:
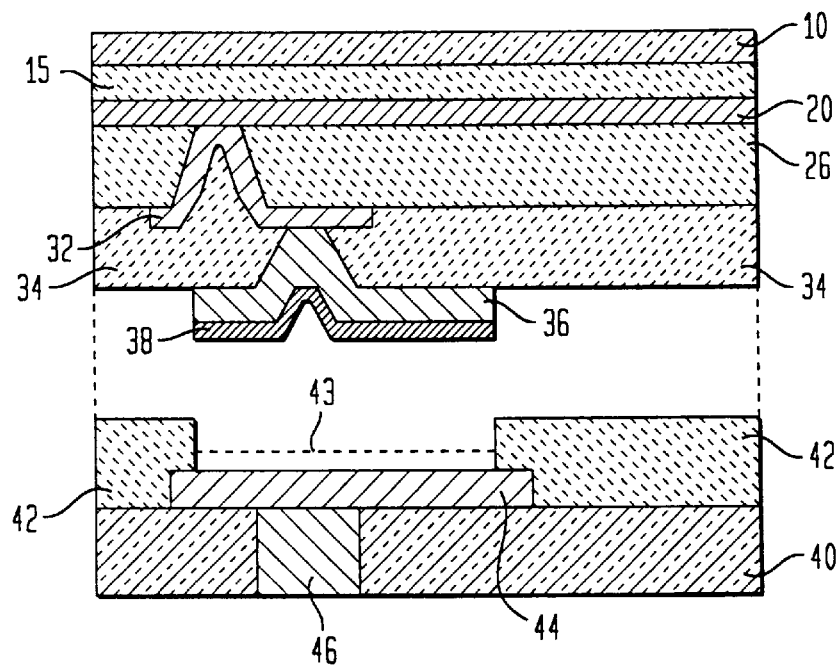
FIG. 7 is a cross-sectional view of the placement of a MLTF structure, formed on a carrier layer, a polymer dielectric layer, and a metal interlayer, over a substrate according to the present invention.

As shown in FIG. 7, the MLTF structure as formed on carrier 10, polyimide 15, and metal interlayer 20 can be inverted and positioned for mounting on a substrate 40. On substrate 40, a capture pad comprises a metallic layer 44 within a dielectric layer 42. The capture pad metallic layer 44 may be electrically connected to an underlying structure (not shown) by via 46. Substrate 40 used with the MLTF structure to form the SCM or MCM can be any metallic (e.g., AlN) or non-metallic material, such as a conductive or non-conductive ceramic or glass substrate, a printed wiring board, plastic card, silicon, aluminum-nitride, diamond, or any other rigid substrate.

The inverted MLTF structure is then placed down and in contact with the capture pad area of substrate 40. The MLTF structure, as still attached to carrier 10, polyimide 15, and metal interlayer 20, is then adhered and joined to the substrate capture pad, for example, by heating joining composition 38 (i.e., solder) to above its melting point and then solidifying the layer to provide mechanical and electrical connection. Where epoxy or a polymer is used as the joining material, the MLTF structure should be placed in contact with the capture pad area before curing the epoxy or polymer. The epoxy or polymer may be cured by heating or by conventional processes other than heating.

As an alternative to the processes described above, another embodiment of the present invention provides that the capture pad metallic layer 44 may include a layer of solder or other joining composition 43, as shown in phantom lines in FIG. 7. Joining composition 43 may be provided in addition to joining composition 38 on the MLTF structure, or instead of joining composition 38.

Figure 8:
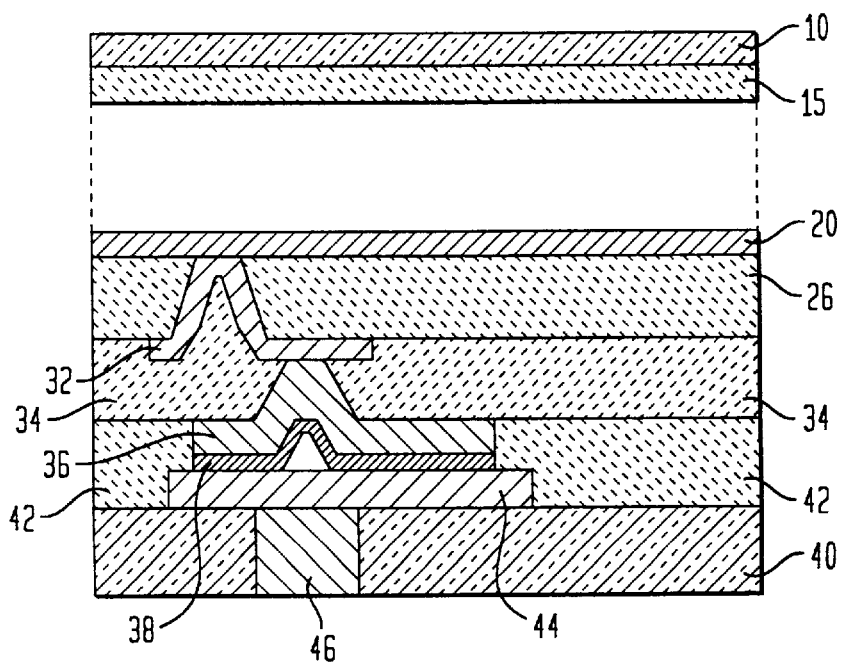
FIG. 8 a cross-sectional view of the joining of a MLTF structure to a substrate and the separation of the carrier layer and the polymer dielectric layer according to the present invention.

Following the joining of the MLTF structure to substrate 40, release of carrier 10, polyimide 15, and metal interlayer 20 from the MLTF structure and substrate 40 can be accomplished using the release process step of the present invention as discussed above. Specifically, dicing may be applied. FIG. 8 illustrates the step of debonding of metal interlayer 20 from polyimide 15. The vertical, dashed lines in FIG. 8 show the separation along the release interface between metal interlayer 20 and polyimide 15 after dicing. (The laser ablation embodiment could also be used, but is not illustrated.) The result is a MLTF structure, having metal interlayer 20 as its terminal metal layer, joined to substrate 40.

Figure 9:
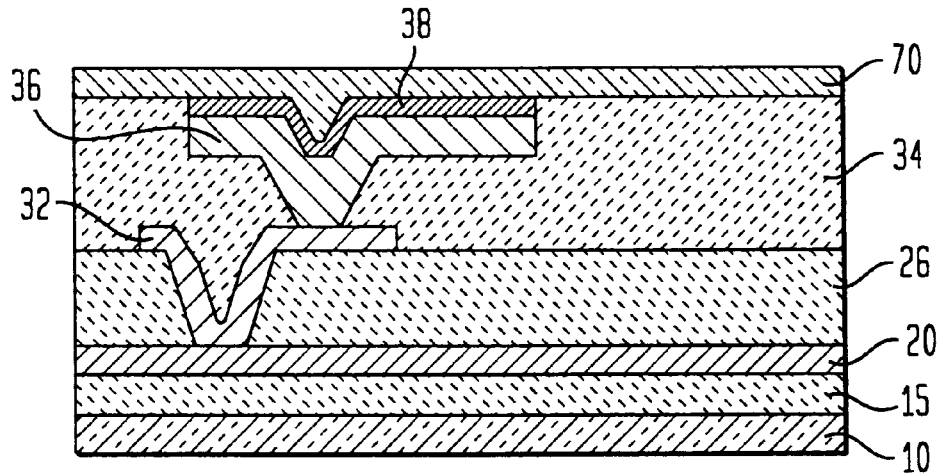
FIG. 9 illustrates a secondary carrier which is laminated to the top of the thin-film structure before the release process step of the present invention is applied (i.e., dicing or laser ablation)

To improve subsequent processing, testing, and handling of the thin-film decal, a more rigid structure can be created. FIG. 9 illustrates a secondary carrier 70 which is laminated to the top of the thin-film structure before the release process step of the present invention is applied (i.e., dicing or laser ablation). A soluble adhesion film such as XU 293 or resist can be applied and cured on the surface of the MLTF structure to facilitate attachment of secondary carrier 70. Secondary carrier 70 is a relatively rigid layer comprising stainless steel, aluminum, Kapton sheet or Teflon material (both available from E.I. DuPont deNemours & Co., Inc. of Wilmington, Del.), or the like. Although relatively rigid, secondary carrier 70 must be sufficiently flexible to bend during the release step; the MLTF structure and secondary carrier 70 are peeled away from polyimide 15 and carrier 10.

Figure 10:
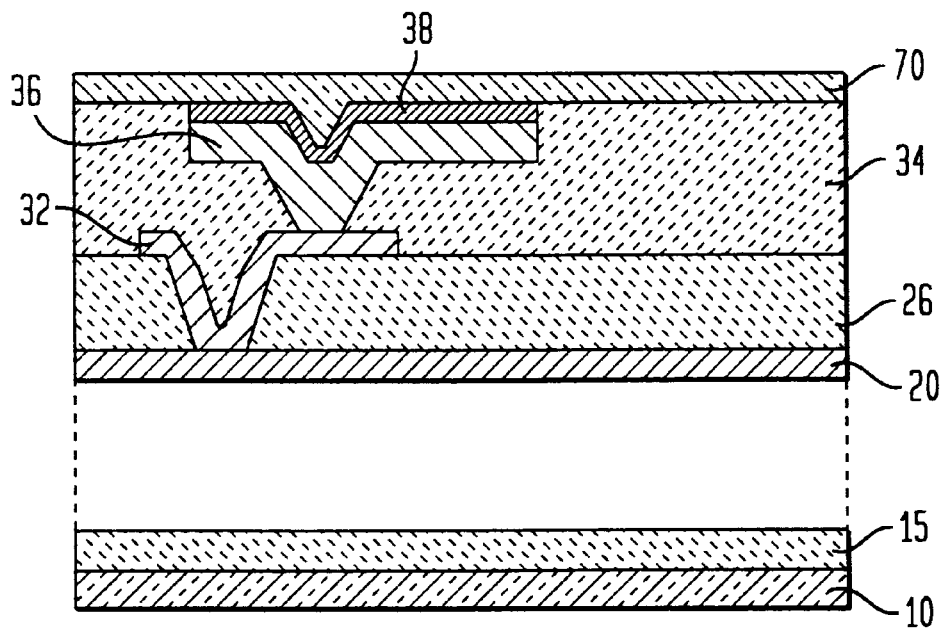
FIG. 10 illustrates the secondary carrier as laminated to the MLTF structure, shown in FIG. 9, after the release step of dicing is completed according to the present invention.

FIG. 10 illustrates the step of debonding of metal interlayer 20 from polyimide 15 after dicing. (The laser ablation embodiment could also be used, but is not illustrated.) The vertical, dashed lines in FIG. 10 show the separation along the release interface between metal interlayer 20 and polyimide 15. The result is a free-standing MLTF structure, having metal interlayer 20 as its terminal metal layer and a secondary carrier 70. Further processing can be conducted on the free-standing MLTF structure to create additional structures, then the structure can be tested and transferred to a permanent substrate before releasing the decal. Secondary carrier 70 facilitates such processing, testing, and handling.

As discussed above, the process of the present invention has at least three, specific applications. First, the MLTF decal can be released from carrier 10 to yield a free-standing film. Second, the decal can be laminated onto a permanent substrate such as aluminum nitride or ceramic (when building top-side down structures) and then released from carrier 10. Third, the decal can be transferred to a secondary temporary carrier (when building top-side up structures), further processing can be conducted on the thin-film decal to create additional structures, then the structure can be tested and transferred to a permanent substrate before releasing the decal.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for releasing a thin-film structure from a primary carrier comprising the steps of:
   a) providing a primary carrier;
   b) applying a dielectric film on the primary carrier;
   c) depositing a metal interconnect on the dielectric film;
   d) forming a thin-film structure on the metal interconnect; and
   e) releasing the thin-film structure and the metal interconnect from the primary carrier and the dielectric film along a release interface defined between the metal interconnect and the dielectric film.

2. The process of claim 1 wherein the step of forming the thin-film structure includes providing at least one dielectric layer and applying at least one wiring path of metallic material.

3. The process of claim 1 wherein the primary carrier is glass.

4. The process of claim 1 wherein the dielectric film is polyimide.

5. The process of claim 1 wherein the step of releasing the thin-film structure and the metal interconnect from the primary carrier and the dielectric film includes dicing the thin-film structure, metal interconnect, primary carrier, and dielectric film then separating the thin-film structure and metal interconnect from the primary carrier and the dielectric film.

6. The process of claim 1 wherein the step of releasing the thin-film structure and the metal interconnect from the primary carrier and the dielectric film includes ablating the dielectric film by directing coherent electromagnetic radiation onto the dielectric film through the thin-film structure.

7. The process of claim 6 wherein a laser is the source of the coherent electromagnetic radiation.

8. The process of claim 1 wherein the metal interconnect includes chromium and copper.

9. The process of claim 8 wherein the metal interconnect is a trilayer of chromium, copper, and chromium.

10. The process of claim 9 wherein the metal interconnect consists of 200–1,000 Å of chromium, 2 $\mu$m of copper, and 200–1,000 Å of chromium.

11. A process for releasing a thin-film structure from a primary carrier comprising the steps of:
    a) providing a glass plate primary carrier;
    b) applying and curing a polyimide dielectric film on the primary carrier;
    c) depositing a chromium, copper, chromium trilayer metal interconnect on the polyimide dielectric film;
    d) forming a multi-layer thin-film structure on the metal interconnect; and
    e) releasing the multi-layer thin-film structure and the metal interconnect from the primary carrier and the dielectric film along a release interface defined between the metal interconnect and the dielectric film.

12. The process of claim 11 wherein the step of forming the multi-layer thin-film structure includes sequentially providing at least two dielectric layers and applying at least two wiring paths of metallic material.

13. The process of claim 11 wherein the step of releasing the multi-layer thin-film structure and the metal interconnect from the primary carrier and the dielectric film includes dicing the multi-layer thin-film structure, metal interconnect, primary carrier, and dielectric film then separating the multi-layer thin-film structure and metal interconnect from the primary carrier and the dielectric film.

14. The process of claim 11 wherein the step of releasing the multi-layer thin-film structure and the metal interconnect from the primary carrier and the dielectric film includes ablating the dielectric film by directing coherent electromagnetic radiation onto the dielectric film through the multi-layer thin-film structure.

15. The process of claim 11 wherein the metal interconnect consists of 200–1,000 Å of chromium, 2 $\mu$m of copper, and 200–1,000 Å of chromium.

* * * * *